United States Patent [19]

Kobayashi

[11] 3,890,576

[45] June 17, 1975

[54] TRANSISTOR AMPLIFYING CIRCUIT

[75] Inventor: Kozo Kobayashi, Tokyo, Japan

[73] Assignee: Nakamichi Research Inc., Tokyo, Japan

[22] Filed: Dec. 26, 1973

[21] Appl. No.: 428,334

[30] Foreign Application Priority Data

Dec. 27, 1972 Japan .................................. 47-4821

[52] U.S. Cl. .................. 330/18; 179/1 VL; 330/15; 330/30 R

[51] Int. Cl. .............................................. H03f 3/42

[58] Field of Search ............ 179/1 A, 1 VL; 330/15, 330/18, 30 R

[56] References Cited

UNITED STATES PATENTS

| | | | |
|---|---|---|---|
| 3,230,397 | 1/1966 | Linder | 330/30 R X |
| 3,256,490 | 6/1966 | Gohm | 330/15 |
| 3,328,713 | 6/1967 | Sukehiro et al. | 330/18 X |
| 3,452,282 | 6/1969 | Beres | 325/424 |

*Primary Examiner*—R. V. Rolinec
*Assistant Examiner*—Lawrence J. Dahl
*Attorney, Agent, or Firm*—Woodling, Krost, Granger & Rust

[57] ABSTRACT

A transistor amplifying circuit comprising a first transistor of grounded emitter type having a base applied with input signal and a second transistor at the emitter thereof connected to the collector of the first transistor. The second transistor has a base connected to a bias circuit of high impedance elements. The second transistor at the base thereof is also connected through a capacitor to the collector of the first transistor so that the second transistor provides high collector impedance thereto. A variable resistor is provided across the collector of the first transistor and a ground and has variable resistance value thereacross. The high collector impedance of the second transistor enables the amplification degree of the first transistor to be determined by the variable resistance value of the variable resistor.

5 Claims, 5 Drawing Figures

TRANSISTOR AMPLIFYING CIRCUIT

FIELD OF THE INVENTION

This invention pertains generally to a preamplifier, and more particularly to a transistor preamplifier suitable for use for a microphone, such as that employed for a tape recorder.

BACKGROUND OF THE INVENTION

Generally, a dynamic microphone has an output level ranging from about + 60 dB in ordinary conversation to about + 120 dB in loudest acoustic sound produced from an orchestra. A conventional transistor preamplifier for a dynamic microphone fails to have such wide dynamic range because a dynamic margin, which indicates a ratio of the maximum input voltage at level of as degree as the preamplifier is not distorted, relative to a reference input voltage is about 40 dB to the utmost. Accordingly, in case the output from the microphone is intended to be recorded, even though a volumetric control associated with the output stage of the preamplifier might lower the output voltage from the preamplilfier so that the recording level were properly maintained, high level of the output from the microphone would initially saturate the preamplifier, resulting in that distortion will occur in recording current. In order to prevent the preamplifier from saturation it may have a lower gain, which causes it to be short of sensitivity at level less than the normal level. In order to accomplish the same purpose the microphone may be connected at the output thereof with a series resistance so that the output level can be lowered, but this causes it to provide the lower signal to noise ratio at level less than ordinary level. Thus, it is difficult that the conventional preamplifier will record acoustic sound with good quality.

OBJECT OF THE INVENTION

Accordingly, it is a principal object of this invention to provide a transistor amplifying circuit most suitably useful as a preamplifier for a dynamic microphone wherein high signal to noise ratio can be obtainable at low input level and wherein there occurs no distortion even though highly leveled so that recording of high quality can be effected.

It is further object of this invention to provide a transistor amplifying circuit wherein it is simple in construction.

SUMMARY OF THE INVENTION

In accordance with the present invention, there is provided a transistor amplifier having input and output means and a power source, comprising a first transistor of grounded emitter type having a base applied with input signal from said input means; a second transistor having an emitter connected to a collector of said first transistor and a collector connected to said power source; bias circuits connected to respective bases of said first and second transistors, one of said bias circuits for said second transistor comprising high impedance elements; a capacitor of predetermined capacitance connected between said collector of said first transistor and said base of said second transistor; and a variable resistor connected between said collector of said first transistor and a ground so that impedance between said collector of said first transistor and said ground can vary, whereby said output means provides variable output thereto with adjustment of said variable resistor.

BRIEF DESCRIPTION OF THE DRAWING

The above and other objects and features of the present invention will become apparent to those skilled in the art from the following description of the preferred embodiments taken along with the accompanying drawing.

DETAILED DESCRIPTION OF THE PREFERRED EMBODIMENTS

Figure 1:
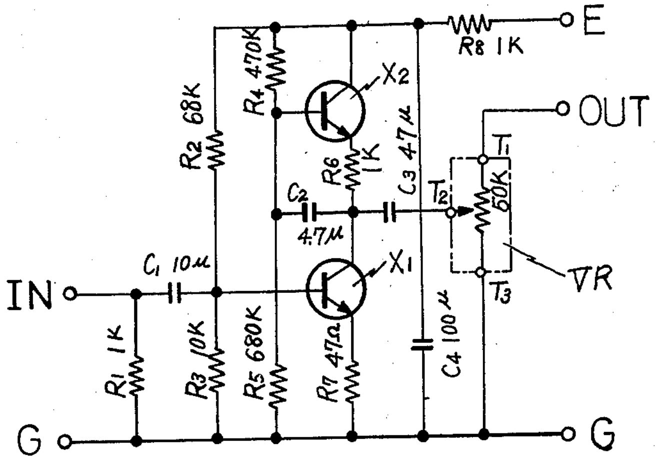
FIG. 1 is a schematic diagram of one embodiment of a transistor amplifying circuit of the present invention.

Referring now to FIG. 1, there is illustrated a transistor amplifying circuit, which comprises a first transistor $X_1$ and a second transistor $X_2$ at an emitter thereof connected to a collector of the first transistor between a power source E and a ground G.

The first transistor $X_1$ has an emitter connected through a resistor $R_7$ to the ground G and a base connected through a capacitor $C_1$ to an input terminal IN and also connected at the connection between resistors $R_2$ and $R_3$ which are in turn connected in series through a resistor $R_8$ across the power source E and the ground G. Thus, the transistor $X_1$ is supplied at the base thereof with bias current from the point between the resistors $R_2$ and $R_3$. The resistor $R_1$ which is connected across the input IN and the ground G, acts as load resistance for an input signal source (not shown) connected thereto. A resistor $R_6$ is disposed between the emitter of the second transistor $X_2$ and the collector of the first transistor $X_1$ to provide higher output impedance thereto. If desired, the resistor $R_6$ may be deleted.

The second transistor $X_2$ has a base connected at the junction point of resistors $R_4$ and $R_5$ which are in turn connected in series through the resistor $R_8$ between the power source E and the ground G. Thus, the transistor $X_2$ is supplied at the base thereof with bias current from the connection between the resistors $R_4$ and $R_5$. As seen from FIG. 1, the resistors $R_4$ and $R_5$ have relatively higher value of resistance.

Figure 2A:
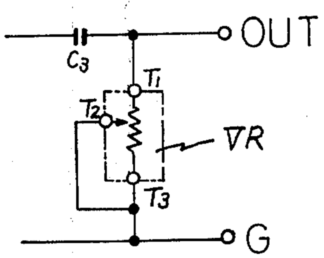
FIGS. 2A and 2b show modifications of the connection of a variable resistor employed for the circuit in accordance with the present invention.
Figure 2B:
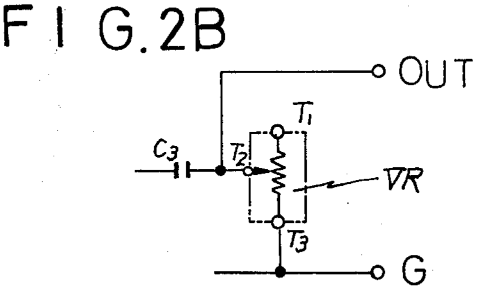

A capacitor $C_2$ which has a predetermined value of capacitance, is connected between the collector of the first transistor $X_1$ and the base of the second transistor $X_2$. A coupling capacitor $C_3$ has one end connected to the collector of the first transistor $X_1$ and the other end connected to a variable terminal $T_2$ of a variable resistor VR. The variable resistor VR has one terminal $T_1$ connected to an output terminal OUT and the other terminal $T_3$ connected to the ground G. As shown in FIG. 2A, the variable resistor VR may be alternatively arranged with the one terminal $T_1$ connected both to the coupling capacitor $C_3$ and to the output terminal OUT and with the other terminal $T_3$ connected both to the variable terminal $T_2$ and to the ground G. Alternatively, as shown in FIG. 2B, the variable resistor VR may be arranged with the variable terminal $T_2$ connected both to the coupling capacitor $C_3$ and to the output terminal OUT and with the one terminal $T_1$ idle.

A capacitor $C_4$ has one end connected at the connection between the resistors $R_8$ and $R_4$ and the other end connected to the ground G and together with the resistor $R_8$ forms a decoupling circuit.

Figure 3:
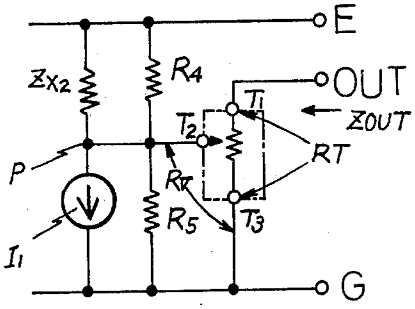
FIG. 3 shows an equivalent circuit to the circuit of FIG. 1 for illustration of the present invention.

FIG. 3 shows an A.C. equivalent circuit of the transistor amplifying circuit of FIG. 1 for illustration of the present invention. In FIG. 3, $I_1$ designates a signal source comprising the first transistor $X_1$ to amplify the input signal from the input terminal IN and $Z_{x2}$ designates collector impedance of the second transistor $X_2$ disposed in a series manner to the signal source $I_1$ between the power source E and the ground G. A point P at which the signal source $I_1$ and the collector impedance $Z_{x2}$ of the second transistor $X_2$ is connected, is connected at the connection between the resistors $R_4$ and $R_5$ which are in turn connected in series to each other between the power source E and the ground G and also to the variable terminal $T_2$ of the variable resistor VR. For convenience of illustration, it is assumed that the resistance value across the point P and the ground G is adjusted by the variable resistor to have the value of $R_r$ although it is adjustable to have any selected value ranging from zero to allover value RT of the variable resistor VR.

The first transistor $X_1$ is of grounded emitter type as shown in FIG. 1 and has an amplification degree "A" expressed by the following formula;

$$A = \frac{-R_L}{Hie + (1 + Hfe)R_E} \cdot Hfe \qquad (1)$$

wherein $R_L$ is load impedance of the first transistor $X_1$, Hfe is current amplification of the transistor $X_1$, Hie is input impedance of the transistor $X_1$ and $R_E$ is emitter load of the transistor $X_1$. It will be understood that the above formula includes the following constant term;

$$\frac{-Hfe}{Hie + (1 + Hfe)R_E} \qquad (2)$$

which is determined by the particular circuit and therefore when the term (2) is expressed by $\alpha$, the formula (1) can be indicated by the expression;

$$A = \alpha R_L \qquad (3)$$

As seen from FIG. 3, load impedance $R_L$ of the first transistor $X_1$ is obtained by composing collector impedance $Z_{x2}$ of the second transistor $X_2$, values of the resistors $R_4$ and $R_5$ and resistance value $R_r$ between the point P and the ground G, that is the effective resistance value of the variable resistor VR. Collector impedance $Z_{x2}$ of the second transistor $X_2$ is generally indicated by the following expression;

$$Z_{x2} = \frac{1}{Hoe} + Hf'e \cdot R_6 \qquad (4)$$

wherein Hoe, Hf'e and $R_6$ indicate output admittance, current amplification and emitter resistance value of the second transistor $X_2$, respectively. In case a commercially available transistor 2S0733 is employed for the second transistor $X_2$, then the output admittance Hoe nearly equals to $10\mu\Omega$ and the current amplification Hf'e to 300. On the other hand, the resistance value $R_6$ equals to $1K\Omega$ as shown in FIG. 1 and therefore, the collector impedance $Z_{x2}$ of the second transistor $X_2$ can be determined as follows;

$$Z_x = \frac{1}{10 \times 10^{-6}} + 300 \times 100 = 400(K\Omega$$

It will be understood that the second transistor $X_2$ would have an extremely higher impedance.

The capacitor $C_2$ which is connected between the collector of the first transistor $X_1$ and the base of the second transistor $X_2$ has a fully high capacitance as seen from FIG. 1, serving to maintain high collector impedance of the second transistor $X_2$. If the capacitor $C_2$ is removed from the circuit, the potential at the collector of the first transistor $X_1$ is applied through the resistor $R_5$ across the base and emitter of the second transistor $X_2$ to provide collector current through the collector and emitter thereof, which causes the transistor $X_2$ to have collector impedance substantially lowered. With the present invention, the capacitor $C_2$ serves to maintain substantially equal potential of the base and emitter of the transistor $X_2$ in A.C., resulting in that no collector current flows through the transistor $X_2$ so that the latter has the collector impedance maintained at high value. Furthermore, the resistors $R_4$ and $R_5$ having higher value required causes the load resistance $R_L$ of the first transistor $X_1$ to equal generally to resistance value $R_r$ obtainable between the point P or variable terminal of the variable resistor VR and the ground and therefore, the expression (3) may be expressed as follows;

$$A = \alpha R_r \qquad (5)$$

As understood from the expression (5), the amplification degree A of the first transistor $X_1$ is proportional to the resistance value $R_r$ obtainable between the point P and the ground G, which is adjusted by the variable terminal $T_2$ of the variable resistor VR. Thus, the amplification degree A of the first transistor $X_1$ can be lowered by adjusting the variable resistor VR so that the resistance value $R_r$ is lowered, while the output terminal OUT provides the output voltage thereto without any distortion over a range from low level to extremely high level. My test shows that the circuit of FIG. 1 provides a dynamic margin of about 66 dB.

Figure 4:
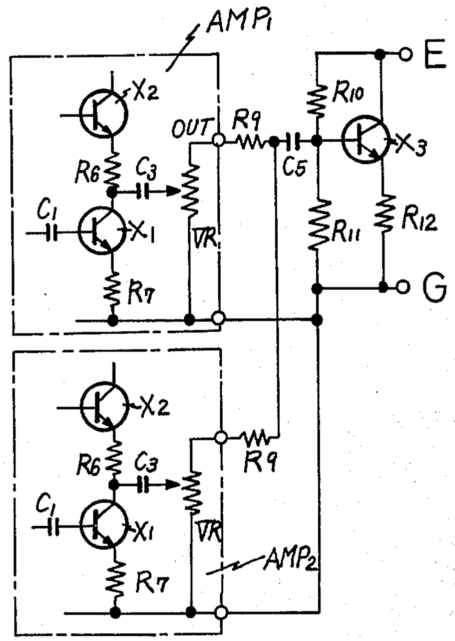
FIG. 4 is a schematic diagram of a mixing circuit in which the amplifying circuits of the present invention are employed.

FIG. 4 shows an embodiment of a mixer or blending circuit in which two amplifying circuits as shown in FIG. 1 are incorporated and the corresponding components to those of FIG. 1 have identical symbols attached thereto. The amplifying circuits $AMP_1$ and $AMP_2$ have the output terminals OUT connected through respective resistors $R_9$ to one end of a coupling capacitor $C_5$, the other end of which is connected to a mixing transistor $X_3$ at the base thereof. The mixing transistor $X_3$ has bias resistors $R_{10}$ and $R_{11}$ connected to the base thereof and an emitter resistor $R_{12}$ connected to the emitter thereof. As seen from FIG. 3, the respective mixing amplifier $AMP_1$ and $AMP_2$ have the output impedances equal generally to allover resistance value $R_T$ of the variable resistor VR when they are viewed from the respective output terminals OUT and having no variation due to positional adjustment of the variable terminals $T_2$ of the variable resistors VR. Thus, it will be understood that interference between the microphone amplifiers $AMP_1$ and $AMP_2$ seldom occurs and therefore, a smooth mixing can be effected by the mixer.

While some embodiments of this invention have been illustrated and described in connection with the accompanying drawing, it will be apparent to those skilled in the art that various changes and modifications might be made without departing from the spirit and scope of this invention, which has been defined only to the appended claims.

What is claimed is:

1. A transistor amplifying circuit having input and output means and a power source, comprising a first transistor of grounded emitter type having a base applied with input signal from said input means; a second transistor having an emitter connected to a collector of said first transistor in a D.C. conductive relationship to each other and a collector connected to said power source; bias circuits connected to respective bases of said first and second transistors, one of said bias circuits for said second transistor comprising high impedance elements; a capacitor having a value of capacitance sufficient to provide a relatively lower impedance for an input signal applied to said first transistor and connected between said base of said second transistor and the junction point of said collector of said first transistor and one end of D.C. conductive means with the other end connected to said emitter of said second transistor so that the output signal from said first transistor is substantially shunted from being applied across said base and said emitter of said second transistor; and a variable resistor connected between said collector of said first transistor and a ground to receive and control said output signal from said first transistor and to output the thus controlled signal to said output means, said variable resistor arranged so that the value of resistance between said junction point and said ground can vary whereby the amplitude of the output signal at said output means is substantially proportional to the value of resistance of said variable resistor between said junction point and said ground with the output impedance of said first transistor at said junction point having a value sufficiently higher than the value of resistance of said variable resistor.

2. A transistor amplifying circuit as set forth in claim 1, and wherein said variable resistor has both ends connected to said output means and a variable terminal connected to said collector of said first transistor.

3. A transistor amplifying circuit as set forth in claim 1, and wherein said variable resistor has both ends connected to said output means and a variable terminal connected to said ground.

4. A transistor amplifying circuit as set forth in claim 1, and wherein said variable resistor has one of the ends connected to said ground and a variable terminal connected both to said collector of said first transistor and to said output means.

5. A mixing circuit comprising a mixing transistor and a plurality of transistor amplifying circuits, each of said transistor amplifying circuits having input and output means and a power source, said output means of said transistor amplifying circuits associated with a base of said mixing transistor, characterized by that each of said transistor amplifying circuits comprises a first transistor of grounded emitter type having a base applied with input signal from said input means; a second transistor having an emitter connected to a collector of said first transistor in a D.C. conductive relationship to each other and a collector connected to said power source; bias circuits connected to respective bases of said first and second transistors one of said bias circuits for said second transistor comprising high impedance elements; a capacitor having a value of capacitance sufficient to provide a relatively lower impedance for an input signal applied to said first transistor and connected between said base of said second transistor and the junction point of said collector of said first transistor and one end of D.C. conductive means with the other end connected to said emitter of said second transistor so that the output signal from said first transistor is substantially shunted from being applied across said base and said emitter of said second transistor; a variable resistor having one of the fixed terminals connected to said base of said mixing transistor and the other fixed terminal connected to a ground, said mixing transistor constituting the output of said mixing circuit, said variable resistor further having the variable terminal connected to said junction point so that the value of resistance between said junction point and said ground can vary, whereby said mixing circuit mixes the output signals from respective transistor amplifying circuits, said output signals proportional to the respective values of resistance of said respective variable resistors between said junction points and said grounds, respectively, by the respective output impedances of said transistor amplifying circuits at said output means thereof maintained substantially constant regardless of the positions of said variable terminals of said respective variable resistors.

* * * * *